US009438800B1

(12) United States Patent
Kozko

(10) Patent No.: US 9,438,800 B1
(45) Date of Patent: Sep. 6, 2016

(54) ENABLING IMAGE STABILIZATION FOR A PANORAMIC CAMERA WITH MULTIPLE FIXED LENSES

(71) Applicant: Dmitry Kozko, Aventura, FL (US)

(72) Inventor: Dmitry Kozko, Aventura, FL (US)

( * ) Notice: Subject to any disclaimer, the term of this patent is extended or adjusted under 35 U.S.C. 154(b) by 320 days.

(21) Appl. No.: 14/144,689

(22) Filed: Dec. 31, 2013

Related U.S. Application Data

(60) Provisional application No. 61/853,711, filed on Apr. 10, 2013, provisional application No. 61/854,397, filed on Apr. 23, 2013.

(51) Int. Cl.
*H04N 5/232* (2006.01)
*H04N 5/225* (2006.01)
*H04N 5/247* (2006.01)

(52) U.S. Cl.
CPC ...... *H04N 5/23258* (2013.01); *H04N 5/23238* (2013.01)

(58) Field of Classification Search
CPC .................. H04N 5/23258; H04N 5/23238
USPC ............................................................. 348/36
See application file for complete search history.

(56) References Cited

U.S. PATENT DOCUMENTS

| | | | | |
|---|---|---|---|---|
| 6,195,122 | B1 * | 2/2001 | Vincent .................. | G01C 11/02 348/169 |
| 8,369,399 | B2 * | 2/2013 | Egnal ..................... | G01C 11/02 375/240.08 |
| 8,896,713 | B2 * | 11/2014 | Corey ................. | H04N 5/23254 348/208.12 |
| 8,957,944 | B2 * | 2/2015 | Doepke ...................... | 348/211.4 |
| 9,007,428 | B2 * | 4/2015 | Zhou ................. | H04N 5/23238 348/36 |
| 2006/0279639 | A1 * | 12/2006 | Silverstein ......... | H04N 5/23248 348/208.14 |
| 2007/0206945 | A1 * | 9/2007 | DeLorme ............... | G03B 41/00 396/332 |
| 2007/0214886 | A1 * | 9/2007 | Sheynblat ............... | G01P 15/18 73/509 |
| 2010/0277617 | A1 * | 11/2010 | Hollinger ............. | H04N 5/2252 348/231.99 |
| 2010/0315520 | A1 * | 12/2010 | Noto ........................ | G03B 5/00 348/208.11 |
| 2011/0141227 | A1 * | 6/2011 | Bigioi ................... | G06T 7/0075 348/36 |
| 2011/0187815 | A1 * | 8/2011 | Asami ..................... | H04N 5/228 348/36 |
| 2012/0004882 | A1 * | 1/2012 | Sheynblat ............... | G01P 15/18 702/141 |
| 2012/0038783 | A1 * | 2/2012 | Noto ..................... | G02B 27/646 348/208.2 |
| 2013/0076921 | A1 * | 3/2013 | Owen ................ | H04N 5/23258 348/208.4 |
| 2013/0329072 | A1 * | 12/2013 | Zhou ...................... | G06T 3/4038 348/222.1 |
| 2013/0342714 | A1 * | 12/2013 | Zhou .................. | H04N 5/23267 348/208.2 |
| 2014/0085493 | A1 * | 3/2014 | Petrescu ............ | H04N 5/23248 348/208.1 |
| 2014/0111608 | A1 * | 4/2014 | Pfeil .................. | H04N 5/23238 348/37 |

* cited by examiner

*Primary Examiner* — Christopher S Kelley
*Assistant Examiner* — Kathleen Walsh
(74) *Attorney, Agent, or Firm* — Patents on Demand P.A.; Brian K. Buchheit; Scott M. Garrett

(57) ABSTRACT

An accelerometer within fixed lenses of a 360 degree camera can be polled for a first sensor reading for a motion data. The data can be changes in a magnitude and/or a direction of a yaw, pitch, and/or roll movement. A second sensor reading of a different motion data from a different accelerometer within a base of the camera affixed to a surface can be obtained. The different motion data can be changes in a magnitude and/or a direction of a yaw, pitch, and/or roll movement. A delta between the datas can be determined, when lens shake or camera shake is detected within at least one of the plurality of fixed lenses. Optics within each of the fixed lenses or camera image sensors can be adjusted based on the delta during media capture.

19 Claims, 5 Drawing Sheets

ENABLING IMAGE STABILIZATION FOR A PANORAMIC CAMERA WITH MULTIPLE FIXED LENSES

CROSS-REFERENCE TO RELATED APPLICATIONS

This application claims priority to provisional application No. 61/853,711, entitled "System and Method for Stitching Videos Received from Multiple Unsynchronized Cameras", filed Apr. 10, 2013, as well as provisional application No. 61/854,397, entitled "360 Degrees Cameras", filed Apr. 23, 2013. Both provisional applications are hereby included in their entirety.

BACKGROUND

The present invention relates to the field of and, more particularly, to enabling image stabilization for a panoramic camera with multiple fixed lenses.

Panoramic content (e.g., imaging and/or video) is becoming increasingly utilized within sporting activities and sporting television broadcasts. For example, many football racing events utilize wide angle imagery to immerse the audience within the event. Panoramic content can often provide a wide angle (e.g., 270 degrees) or ultra wide angle (e.g., 360 degrees) view of a sporting arena/event. Many times panoramic content utilizes panoramic cameras to capture images/video during pivotal occurrences. For example, 360 degree cameras can be positioned around a playing field to show actions performed by players.

Panoramic content can often be obtained from multiple cameras which can include multiple images/video which can be stitched/composed together to create a single panoramic content (e.g., stitched panoramas). For example, multiple cameras around a race track can take multiple images of race cars from different angles which can be stitched together to create an ultra wide angle view of the race track. Often times, panoramic cameras can be subject to varying degrees of motion which can affect the images/video captured by the cameras. Optical image stabilization solutions typically cannot be applied to panoramic camera lenses due to space restrictions within the lens. As such, frequently digital image stabilization is utilized.

Digital image stabilization is often performed to improve image quality and reduce or eliminate motion blur during/after image capture. However, the limits of digital stabilization are quickly met in applications where the panoramic camera is subject to high speeds, rapid vibrations, and irregular movement. For example, panoramic cameras attached to cars in automotive racing sporting events can be subject to significant vibrational motion which can drastically reduce video quality. When digital image stabilization fails, the resultant content can be confusing, misleading, and difficult to view.

BRIEF SUMMARY

One aspect of the present invention can include a system, a computer program product, an apparatus, and a method for enabling image stabilization for a panoramic camera with multiple fixed lenses. An accelerometer within fixed lenses of a 360 degree camera can be polled for a first sensor reading for a motion data. The data can be changes in a magnitude and/or a direction of a yaw, pitch, and/or roll movement. A second sensor reading of a different motion data from a different accelerometer within a base of the camera affixed to a surface can be obtained. The different motion data can be changes in a magnitude and/or a direction of a yaw, pitch, and/or roll movement. A delta between the datas can be determined, when lens shake or camera shake is detected within at least one of the plurality of fixed lenses. Optics within each of the fixed lenses or camera image sensors can be adjusted based on the delta during media capture.

Another aspect of the present invention can include an apparatus, a computing program product, a method, and a system for enabling image stabilization for a panoramic camera with multiple fixed lenses. A stabilization system of a 360 degree camera can include a camera housing, a set of fixed lenses, and a camera base. Each of the set of lenses can include an accelerometer, one or more optic lenses, and an optic lens adjustment mechanism. The base can be coupled to the camera housing. The base can include an accelerometer and a mounting hardware. When the camera is affected by motion during a media capture process, the stabilization system can trigger the adjustment mechanism of each of the set of lenses to compensate for the motion based on an aggregate adjustment computed from motion data collected from each of the accelerometers of the set of lenses. A data store can be configured to persist the aggregate adjustment and the motion data. The motion data can be a magnitude and a direction associated with the motion.

DETAILED DESCRIPTION

Figure 1A:
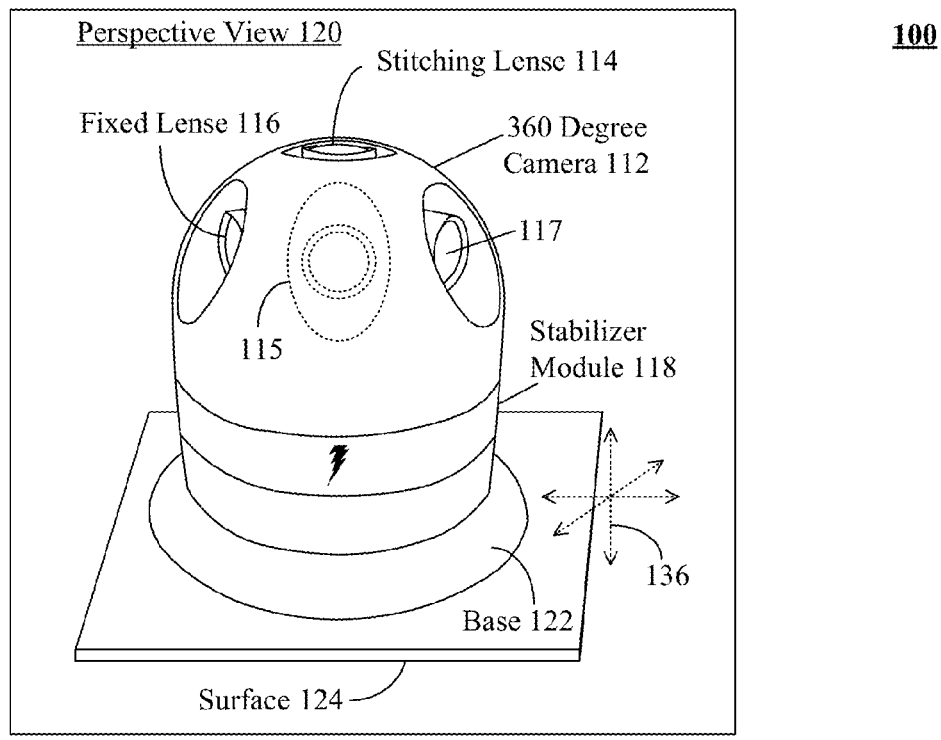
FIGS. 1A and 1B are schematic diagrams illustrating a set of views of a 360 degree camera for optical stabilization within the camera in accordance with an embodiment of the inventive arrangements disclosed herein.

The present disclosure is a solution for enabling image stabilization for a panoramic camera with multiple fixed lenses. In the solution, a 360 degree camera can utilize sensors within fixed lenses within the camera and sensors within the camera base to perform optical and/or digital stabilization. In one instance, the camera can aggregate different lens motion data to perform stabilization. In the instance, camera can poll in-lens MEMS (microelectromechanical systems) for motion data associated with camera movement (e.g., vibration from an attached surface) to determine one or more adjustments for each lens.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1B:
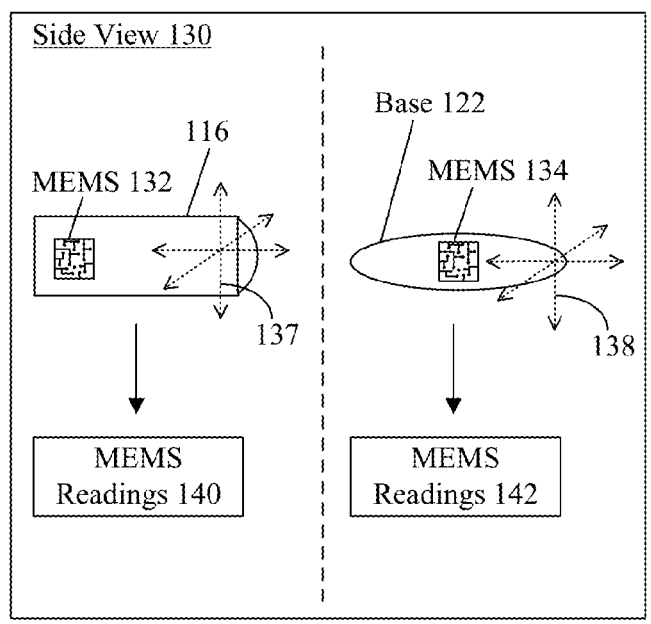

FIGS. 1A and 1B are schematic diagrams illustrating a set of views 120, 130 of a 360 degree camera for optical stabilization within the camera in accordance with an embodiment of the inventive arrangements disclosed herein. Views 120, 130 can show one or more optical stabilization components which can enable camera 112 can be optically stabilized while undergoing movement 136. In view 120, a 360 degree camera 112 can be affixed to surface 124 via base 122 and can record audio, video, and/or images. For example, a panoramic camera can be attached to a wall of a building near a parade route to capture a video footage of a parade. Camera 112 base 122 can be securely affixed to surface or can be placed onto surface without coupling. Camera 112 can include one or more fixed lenses 114, 115, 116, 117. In one instance, fixed lens 114 can be a stitching lens which can provide camera 112 with the capability to stitch media captured from each lens 115, 116, 117 into a panoramic media. For example, fixed lens 114 can be an ultra wide angle lens which can provide image data which can aid in feature detecting and/or alignment during an image stitching process.

In one instance, camera 112 can include three lenses arranged within in a single plane perpendicular to a vertical axis and a stitching lens can be oriented longitudinally along the vertical axis. For example, the camera 112 can capture video and/or images from a 360 degree horizontal field of view and a 270 degree vertical field of view. It should be appreciated that camera 112 can include an arbitrary quantity of lenses.

During media capture, camera 112 can undergo movement from one or more external forces acting on camera 112 and/or surface 124. For example, forces (e.g., acceleration, deceleration) affecting surface 124 can create surface movement 136 (e.g., tilt) which can be transferred to camera 112 and camera 112 components. Consequently, camera 112 and/or camera 112 components can be subject to movement 136 which can affect the path of light through lenses 114, 116 causing motion blur within media captured by lenses 114-117. The disclosure describes a novel solution for performing optical and/or digital image stabilization for a 360 degree panoramic camera with multiple fixed lenses. It should be appreciated that camera/lens shake can be determined via traditional and/or proprietary means. It should be appreciated that although a lens shift solution is described, a sensor shift solution is also contemplated.

In one instance, camera 112 can include a stabilization module 118 which can permit feedback relating to motion of fixed camera lenses 114-117 relative to motion of the base 122. In the instance, the feedback (e.g., readings 140, 142) can be sampled from multiple locations which can be utilized to perform automatic adjustments which can be added/removed from different lenses when attempting to stabilize media (e.g., images). For example, the base can include multiple MEMS 134 which can provide multiple samples of motion data to enable optical and/or digital image stabilization. It should be appreciated that the disclosure is not limited to a stabilization module 118 and the functionality described herein can be distributed over one or more components of camera 112.

Side view 130 can present a cross sectional view of a lens 114 and a base 122. It should be appreciated that view 130 has been simplified to ensure clarity and the disclosure is not limited to the arrangement presented. View 130 represents camera 112 operating under circumstances which create motion 137, 138 (e.g., as a result of motion 136). For exemplary purposes, movement 136 can correspond to a force such as motion, vibration, sound, and the like. For example, when camera 112 is attached to a moving object such as a vehicle, vehicle acceleration and vehicle body vibration can affect lens 114-117 function which can be appropriately corrected utilize the techniques described herein.

In one instance, MEMS 132, 134 can be an accelerometer able to measure proper acceleration affecting lens 116 and/or base 112. Forces can include static and/or dynamic forces such as gravitation pull, movement, vibration, and the like. It should be appreciated that movement 136 can affect components of camera 112 differently based on magnitude of the force, direction, dampening, and the like. For example, lens 114 can be affected by a small movement 137 and base can be affected by a large movement 138 since the base and/or camera housing can dampen movement 136. As such, the disclosure can utilize multiple MEMS 132, 134 to obtain different measurements 140, 142 for each component affected by the movement 136.

In one instance, MEMS 132, 134 can have different sensitiveness to perform aggressive and/or conservative motion detection and/or correction. For example, MEMS 132 within lens can have coarser sensitivity to detect and correct for smaller movements while MEMS 134 within base can have finer sensitivity to detect larger movements.

It should be appreciated that the disclosure can compensate for different sampling rates associated with MEMS 132, 134. For example, when MEMS 132, 134 bandwidth differs, the disclosure can utilize traditional synchronization techniques to optimize sampling rates for each MEMS 132, 134.

In one instance, MEMS 132, 134 bandwidth can correlate to expected vibration measurements. In the instance, MEMS 132 bandwidth can be low (e.g., 100 Hz) to due to vibration absorption of camera 112 housing while MEMS 134 bandwidth can be greater (e.g., 400 Hz) due to being a primary absorber of vibration (e.g., from movement 136). For example, the bandwidth of MEMS 134 within base can be higher to compensate for high energy vibration while the bandwidth of MEMS 132 can be lower to compensate for low energy vibration.

Drawings presented herein are for illustrative purposes only and should not be construed to limit the invention in any regard. It should be appreciated that the disclosure functionality described herein can be applied to stitching lens 114. It should be noted that camera 112 can lack a dedicated stitching lens and can include multiple fixed lenses, each able to function as a stitching lens. It should be appreciated that base 122 of camera 112 can include the camera 112 housing.

It should be appreciated that MEMS 132, 134 can include one or more microsensors, microactuators, microelectronics, microstructures, and the like. That is, MEMS 132, 134 can perform optical stabilization within each lens 114-117 as described herein. It should be appreciated that the disclosure is not limited to MEMS and can include traditional electromechanical components including, but not limited to, ultrasonic motors, electromechanical accelerometers, magnetic yokes, driving coils, and the like.

Figure 2:
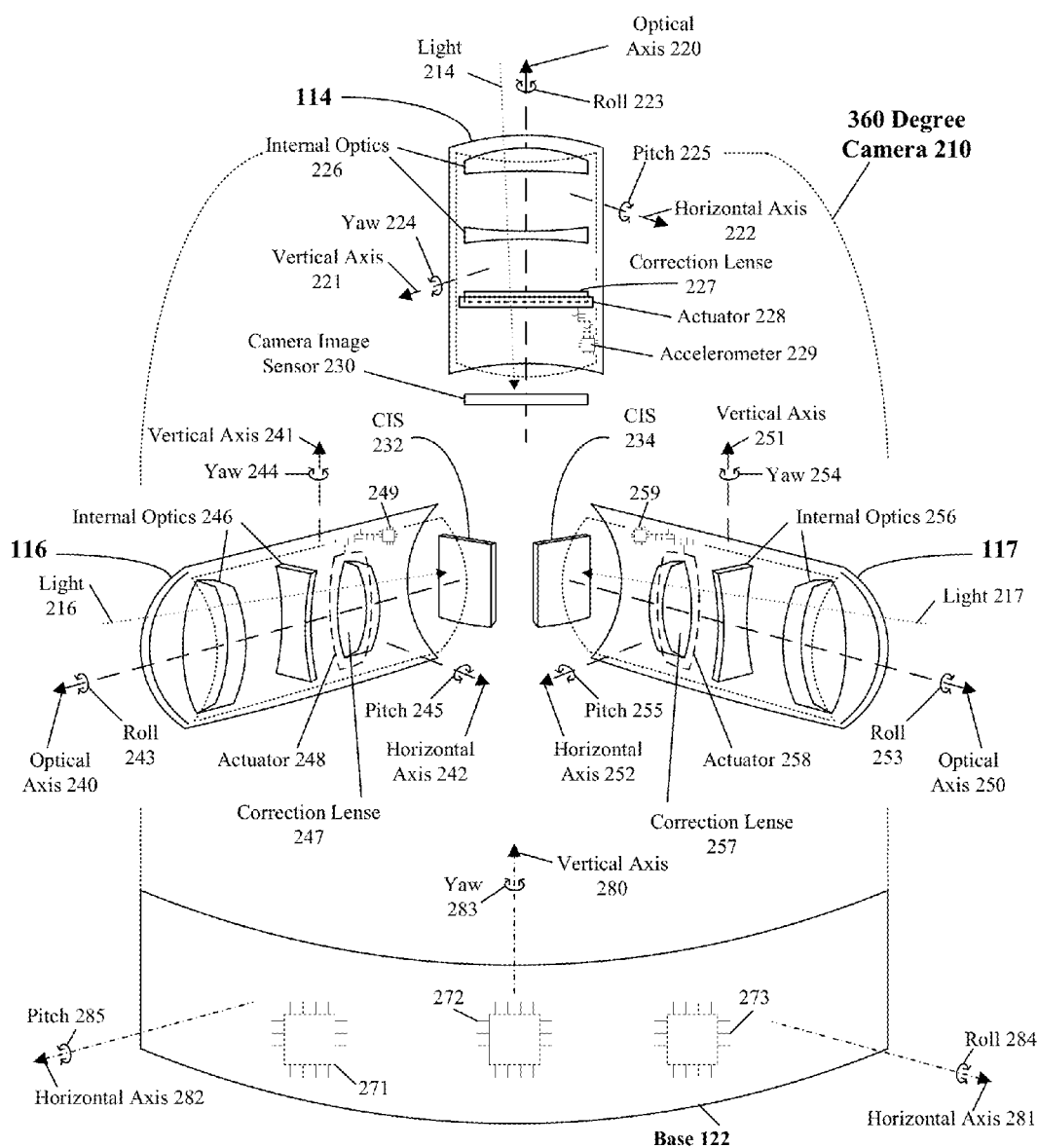
FIG. 2 is a schematic diagram illustrating a simplified cross sectional perspective view of a 360 degree camera in accordance with an embodiment of the inventive arrangements disclosed herein.

FIG. 2 is a schematic diagram illustrating a simplified cross sectional perspective view 200 of a 360 degree camera 210 in accordance with an embodiment of the inventive arrangements disclosed herein. In one instance, camera 210 can lack a stabilization module 118. In the instance, stabilization components (e.g., correction lens 227, actuator 228, accelerometer 229) can be distributed within each lens 114-117. For the sake of clarity, lens 115 has been intentionally omitted from the diagram of camera 210. It should be appreciated that lens 115 configuration can be similar to the arrangement of lens 114, 116, 117 or can be different.

In view 200, the base 122 and each lens 114-117 can be associated with individual axes of orientation which can establish a frame of reference in which to detect movement. Lens 114-117 and base 122 can detect movement via one or more accelerometer sensors 229, 249, 259, 271, 272, 273 (e.g., MEMS). Base 122 can be associated with a vertical axis 280 and two horizontal axes 281, 282. Movement affecting base 122 can correspond to yaw 283, roll 284, pitch 285 as detected by sensor 271, 272, 273. Lens 114 can be associated with an optical axis 220, vertical axis 221, and a horizontal axis 222. Movement affecting lens 114 can correspond to roll 223, yaw 224, and pitch 225 as detected by sensor 229. Lens 116 can be associated with an optical axis 240, vertical axis 241, and a horizontal axis 242. Movement affecting lens 116 can correspond to roll 243, yaw 244, and pitch 245. Lens 117 can be associated with an optical axis 250, a vertical axis 251, and a horizontal axis 252. Movement affecting lens 117 can correspond to roll 253, yaw 254, and pitch 255.

That is, each lens 114-117 within camera 210 can detect movement (e.g., 137) and perform optical image stabilization utilizing motion data obtained from other lenses and/or base 122.

Each lens 114-117 can include internal optics 226, 246, 256 which can transmit light 214, 216, 217 to camera image sensor (CIS) 230, 232, 234. Lenses 114-117 can include correction lens 227, 247, 257 which can be an optical lens able to be moved by and actuator 228, 248, 258 to counteract movement. Actuator 228, 248, 258 can operate independently and/or in unison to ensure light 214, 216, 217 correctly reaches CIS 230, 232, 234. In one instance, actuator 228, 248, 258 can receive movement instructions from a single processor (e.g., master processor) which can coordinate each lens adjustment.

In one instance, base 122 can include accelerometers 271, 272, 273 which can be aligned to approximately correspond to lens position within camera 210. In the instance, accelerometers 271, 272, 273 can measure movement in different regions of the base which can provide movement data which can be appropriate to each lens 114-117. For example, accelerometer 271 can capture motion data which can be utilized to assist in optical stabilization of lens 116 and/or digital stabilization of media captured by lens 116.

It should be appreciated that one or more lenses 114-117 can lack optical stabilization capabilities. That is, camera 210 can utilize any combination of digital stabilization and optical stabilization to achieve desired results. For example, stitching lens 114 can lack accelerometers and/or optical stabilization capabilities which can be compensated by utilizing digital stabilization from motion data obtained from other lenses 114, 117 and/or base 122.

It should be appreciated that the disclosure can utilize traditional and/or proprietary single axis sensors which can detect movement in a vertical/horizontal axis, or two axis sensors which can detect movement within a horizontal and a vertical axes or three axis sensors which can detect movement within two horizontal axis and a vertical axis. In one instance, the disclosure can address traditional image stabilization limitations by compensating for roll 223, 243, 253 along an optical axis 220, 240, 250 through the use of multiple sensors (e.g., each with a two axis sensor) within lenses 114-117 and/or base 122. By combining two or more two axis sensors (e.g., perpendicularly), a three axis stabilization can be achieved by mapping movement associated with an axis from a sensor to a different axis from a different sensor. For example, to detect roll 223 within lens 114, movement detected within vertical axis 241 can be utilized as a supplement since the axes correspond to the same orientation.

Drawings presented herein are for illustrative purposes only and should not be construed to limit the invention in any regard. It should be appreciated that coordinate axes presented herein are for exemplary purposes only and can change based on orientation of camera 210, lens 114-117 arrangement, and the like. It should be appreciated that the disclosure can compensate for axial shift along any optical axis, horizontal axis, and/or vertical axis.

Figure 3A:
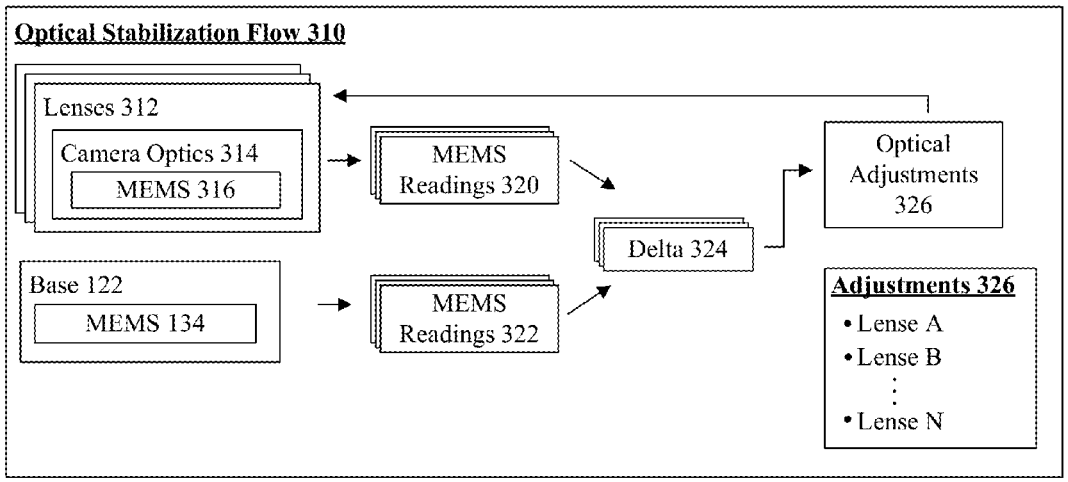
FIGS. 3A and 3B are schematic diagrams illustrating an optical stabilization flow and a digital stabilization flow in accordance with an embodiment of the inventive arrangements disclosed herein.
Figure 3B:
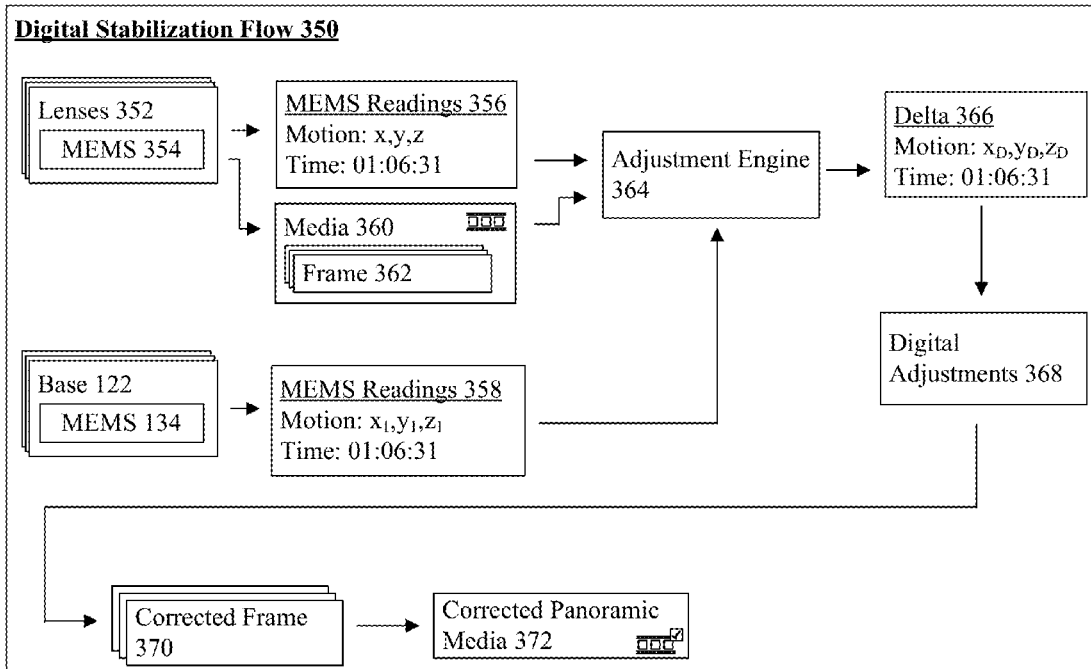

FIGS. 3A and 3B are schematic diagrams illustrating an optical stabilization flow 310 and a digital stabilization flow 350 in accordance with an embodiment of the inventive arrangements disclosed herein. Optical stabilization flow 310 can illustrate one contemplated embodiment for performing optical stabilization utilizing sensor readings from base 122 and lens 312. Digital stabilization flow 350 can illustrate one contemplated embodiment for performing digital stabilization utilizing sensor readings from base 122 and lens 352.

In optical stabilization flow 310, MEMS readings 320, 322 can be evaluated to produce a delta 324. Readings 320, 322 can be obtained from one or more MEMS 316, 134 within lens 312 and base 122. In one instance, delta 324 can be a difference in between movement recorded by MEMS 316 and MEMS 134. For example, delta 324 can determine a difference between a MEMS 316 recording an acceleration of 0.4 Gs on a vertical axis and a MEMS 134 recording the same acceleration of 0.3 Gs on the vertical axis. It should be appreciated that delta 324 can be computed utilizing traditional and/or proprietary statistical computing algorithms.

In one embodiment, delta 324 can be utilized to produce one or more optical adjustments 326. In the embodiment, adjustments 326 can include adjustments for each lens 312 within a camera (e.g., camera 112). For example, a delta 324 can be computed for each lens within camera 112 and can be utilized to perform lens specific adjustments 326 (e.g., an adjustment for a first lens Lens A, an adjustment for a second lens Lens B, etc.). Adjustments 326 can be conveyed to optics 314 and/or lenses 312 to enable optical adjustments to be performed in real-time or near real-time.

In digital stabilization flow 350, one or more MEMS readings 356, 358 can be obtained from MEMS 354, 134. Readings 356, 358 can include motion data, timing information, and the like. For example, readings 356 can include values for movement within a three dimensional coordinate system (e.g., x, y, z) and a timing value (e.g., at one minute and six seconds) associated with the time index in which the movement data was recorded. In one embodiment, the readings 356, 358 can be associated with one or more frames 362 of a media 360 recorded by lenses 352. For example, a frame 362 can be associated with a sensor reading 356 which can indicate the amount of movement affecting the lens 352 during the recording of the frame 362 and a sensor reading 358 which can indicate the amount of movement affecting the base 122 during the recording of the frame 362.

Readings 356, 358 and media 360 can processed by engine 364 to determine one or more deltas 366 between reading 356, 358 for each frame 362. For example, delta 366 can determine the resultant change in position of the lens 352 in three dimensions (xD, yD, zD) associated with a time (e.g., frame 362). In one embodiment, the delta 366 can be utilized to determine one or more digital adjustments 368 which can be applied to frame 362. In the embodiment, adjustments 368 can include frame shifting adjustments, cropping adjustments, frame interpolation, and the like.

In one instance, adjustments 368 can be applied to each frame 362 requiring adjustments within media 360. In the instance, corrected frame 370 can be created responsive to the application of adjustments 368. In one embodiment, frames 370 can be stitched together to create a corrected panoramic media 372 which can be free of motion blur or significantly reduced motion blur.

Drawings presented herein are for illustrative purposes only and should not be construed to limit the invention in any regard. It should be appreciated that the corrected panoramic media 372 can undergo a manual and/or automated review process to improve the accuracy of adjustments 368. It should be appreciated that MEMS 316, 134 data acquisition can conform to traditional and/or proprietary techniques.

Figure 4:
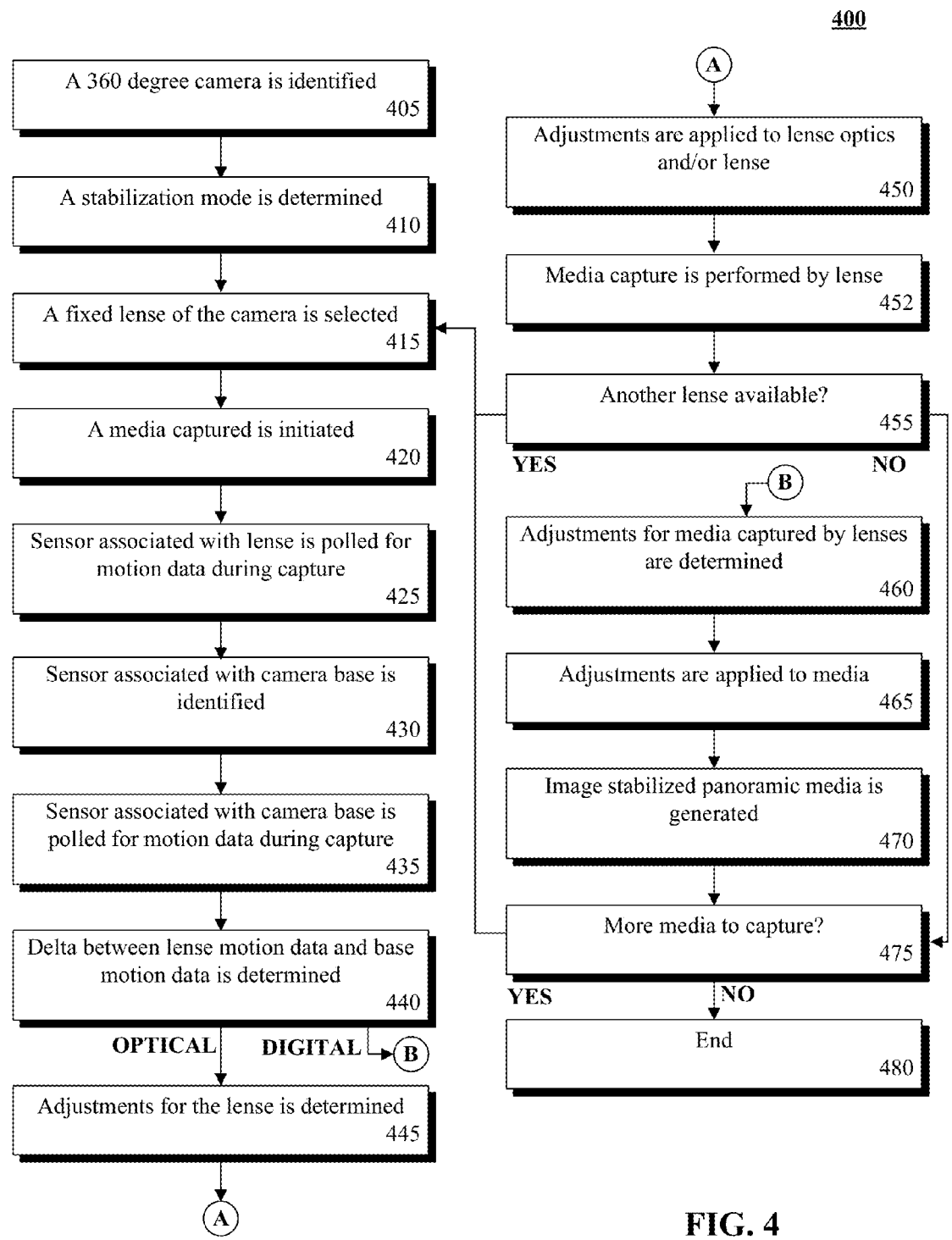
FIG. 4 is a flowchart illustrating a method for enabling image stabilization for a panoramic camera with multiple fixed lenses in accordance with an embodiment of the inventive arrangements disclosed herein.

FIG. 4 is a flowchart illustrating a method 400 for enabling image stabilization for a panoramic camera with multiple fixed lenses in accordance with an embodiment of the inventive arrangements disclosed herein. In method 400, a 360 degree camera can utilize feedback from fixed camera lenses relative to the base to perform optical and/or digital stabilization.

In step 405, a 360 degree camera can be identified. In step 410, a stabilization mode can be determined. Stabilization mode can be manually and/or automatically determined. In step 415, a fixed lens of the camera can be selected. In step 420, a media capture can be initiated. In step 425, a sensor associated with the lens can be polled for motion data during capture. In step 430, a sensor associated with the camera base can be identified. Sensor selection can be based on sensor sensitivity, position within base, lens affiliation, camera settings, user preferences, and the like. In step 430, the sensor associated with the camera base can be polled for motion data during capture.

In step 440, a delta between the lens motion data and the base motion data can be determined. Based on the determined stabilization mode, the method can continue to step 445 for an optical stabilization mode or else proceed to step 460 for a digital stabilization mode. In step 445, adjustments for the lens or camera image sensor is determined. In step 450, adjustments can be applied to lens optics, camera image sensor, and/or lens. In step 452, media capture can be performed by the lens and/or camera image sensor. In step 455, if another lens is available, the method can return to step 415, else continue to step 475.

In step 460, adjustments for media captured by lenses are determined. In step 465, adjustments are applied to the media. In step 470, an image stabilized panoramic media can be generated from one or more media. In step 475, if more there is more media to capture, the method can return to step 415, else continue to step 480. In step 480, the method can end.

Drawings presented herein are for illustrative purposes only and should not be construed to limit the invention in any regard. It should be appreciated that method 400 can include one or more optional steps permitting the functionality of the method 400 is retained. Method 400 can be performed in serial and/or in context. Method 400 can be performed in real-time or near real-time. It should be appreciated that the camera can perform hybrid stabilization by combining optical and digital stabilization.

Figure 5:
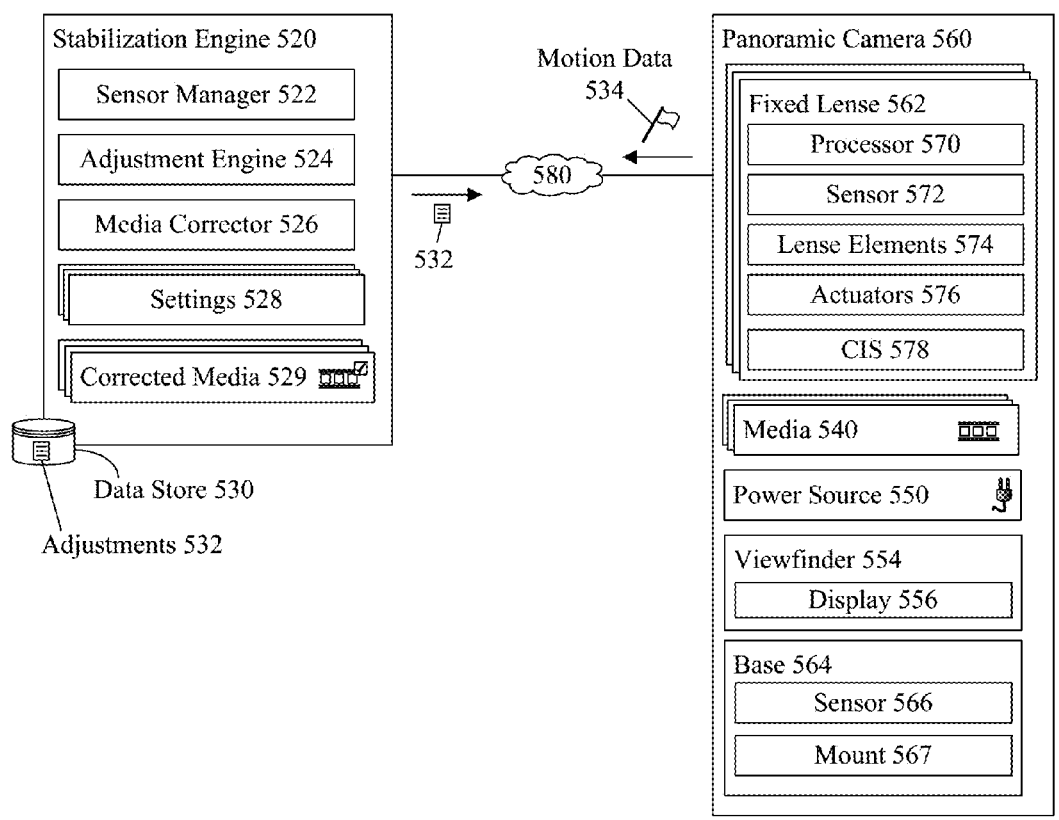
FIG. 5 is a schematic diagram illustrating a system for enabling image stabilization for a panoramic camera with multiple fixed lenses in accordance with an embodiment of the inventive arrangements disclosed herein.

FIG. 5 is a schematic diagram illustrating a system 500 for enabling image stabilization for a panoramic camera with multiple fixed lenses in accordance with an embodiment of the inventive arrangements disclosed herein. In system 500, stabilization engine 520 can provide adjustments 532 to camera 360 to enable camera 560 to perform image stabilization utilizing lens based sensors 572 and base sensors 566.

Stabilization engine 520 can be a hardware/software entity for performing image stabilization. Engine 520 can include, but is not limited to, sensor manager 522, adjustment engine 524, media corrector 526, settings 528, corrected media 529, data store 530, and the like. Engine 520 functionality can include, but is not limited to, encryption, hot swap functionality, and the like. In one instance, engine 520 can be a functionality of a stabilization module (e.g., module 118). Engine 520 can be communicatively linked to camera 360 via one or more wired or wireless technologies (e.g., network 380). It should be appreciated that engine 520 can support active and passive image stabilization modes.

Sensor manager 522 can be a hardware software element for handling sensor 572, 566. Manager 522 functionality can include, but is not limited to, diagnostic functionality, data collection, and the like. Manager 522 can be utilized to selectively enable/disable sensors 572, 566, data collection, and the like. In one instance, manager 522 can be utilized to detect common image stabilization conditions including, but not limited to, "camera shake", low light scenes, and the like. For example, manager 522 can be utilized to detect jitter and/or smear.

Adjustment engine 524 can be a hardware/software entity for determining adjustments 532. Engine 524 functionality can include, but is not limited to, calculating motion deltas, controlling actuators 576, and the like. In one embodiment, adjustment engine 524 can generate instructions for performing optical stabilization (e.g., lens based, image sensor based) and/or digital stabilization. In the embodiment, engine 524 can encode/decode instructions for actuators 576 within lens 562 to perform during image stabilization. In one instance, engine 520 can coordinate the use of optical and digital stabilization to produce media 529.

Media corrector 526 can be a hardware/software element for performing image stabilization upon media 540. Corrector 526 functionality can include but is not limited to, stabilization filters, high sensitivity manipulation, and the like. Corrector 526 can utilize traditional and/or proprietary digital stabilization to correct media 540.

Settings 328 can be one or more rules for establishing the behavior of system 500, engine 520, and the like. Settings 528 can include, but is not limited to, sensor manager 522 options, adjustment engine 524 settings, media corrector 526 options, and the like. In one instance, settings 528 can be manually and/or automatically established. In the embodiment, settings 528 can be heuristically established based on historic settings. Settings 528 can be persisted within data store 530, camera 560, and the like.

Data store 530 can be a hardware/software component able to persist settings 528, media 540, corrected media 529, and the like. Data store 530 can be a Storage Area Network (SAN), Network Attached Storage (NAS), and the like. Data store 530 can conform to a relational database management system (RDBMS), object oriented database management system (OODBMS), and the like. Data store 530 can be communicatively linked to engine 520 in one or more traditional and/or proprietary mechanisms. In one instance, data store 530 can be a component of Structured Query Language (SQL) complaint database.

Network 380 can be an electrical and/or computer network connecting one or more system 300 components. Network 380 can include, but is not limited to, twisted pair cabling, optical fiber, coaxial cable, and the like. Network 380 can include any combination of wired and/or wireless components. Network 380 topologies can include, but is not limited to, bus, star, mesh, and the like. Network 380 types can include, but is not limited to, Local Area Network (LAN), Wide Area Network (WAN), Virtual Private Network (VPN) and the like.

Camera 560 can be include, but is not limited to, a fixed lens 562, a media 540, a power source 550, a viewfinder 554, a base 564, and the like. Lens 562 can include, but is not limited to, a processor, a sensor 572 (e.g., accelerometer), lens elements 574, actuators 576, camera image sensor (CIS) 578, and the like. In one instance, camera 560 can convey motion data 534 to engine 520 which can provide one or more stabilization adjustments 532 in real-time or near real-time. In one embodiment, camera 560 can present settings 528, adjustments 532, media 529, media 540 within display 556 of viewfinder 554. In one instance, base 564 can include a mount 567 which can permit camera 560 to be attached to a surface. In the instance, mount 567 can include a sensor 566 (e.g., MEMS) which can be utilized to perform functionality described herein.

Drawings presented herein are for illustrative purposes only and should not be construed to limit the invention in any regard. It should be appreciated that one or more components within system 500 can be optional components permitting that the disclosure functionality be retained. It should be understood that engine 520 components can be optional components providing that engine 520 functionality is maintained. It should be appreciated that one or more components of engine 520 can be combined and/or separated based on functionality, usage, and the like. It should be appreciated that engine 560 can perform one or more post production functions including, but not limited to, noise reduction, image stitching, and the like. Sensors 572, 566 can include traditional accelerometer characteristics including, but not limited to, axes, swing, sensitivity, bandwidth, and the like.

The flowchart and block diagrams in the FIGS. 1-5 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for image stabilization comprising:
   polling an accelerometer within a plurality of fixed lenses of a 360 degree camera for a first sensor reading comprising of a motion data, wherein the motion data are changes in at least one of a yaw movement, pitch movement, and roll movement, wherein the motion data is at least one of a magnitude and a direction associated with the yaw, pitch, and roll movement;
   obtaining a second sensor reading of different motion data from a different accelerometer within a base of the camera, wherein the base is affixed to a surface, wherein the different motion data is changes in at least one of a yaw movement, pitch movement, and roll movement, wherein the different motion data is at least one of a magnitude and a direction associated with the yaw, pitch, and roll movement;
   determining a delta between the motion data and the different motion data, wherein the delta is a difference in at least one of the magnitude and direction of the motion data and the different motion data, when lens shake or camera shake is detected within at least one of the plurality of fixed lenses; and
   responsive to the determining adjusting the at least one of a plurality of optics within each of the plurality of fixed lenses and a plurality of camera image sensors based on the delta during media capture by at least one of the plurality of fixed lenses of the 360 degree camera, wherein a plurality of actuators within each of the plurality of fixed lenses compensate for movements not exceeding a previously established motion threshold, wherein the compensation of each of the plurality of actuators is different.

2. The method of claim 1, further comprising:
   stitching together video obtained from each of the plurality of fixed lenses as a panoramic video.

3. The method of claim 1, further comprising:
   encoding the motion data of the accelerometer responsive to the accelerometer detecting a change in at least one of yaw and pitch; and
   responsive to the encoding, conveying the motion data to an optical stabilization actuator within each of the plurality of fixed lenses.

4. The method of claim 1, further comprising:
   encoding the motion data of the different accelerometer responsive to the different accelerometer detecting a change in at least one of yaw and pitch;
   responsive to the encoding, conveying the motion data to an optical stabilization actuator within each of the plurality of fixed lenses.

5. The method of claim 1, wherein at least one of the plurality of fixed lenses is a stitching lens, wherein the stitching lens comprises of a six axis stabilization system, wherein the system obtains motion data from the different accelerometer to perform the six axis stabilization.

6. The method of claim 1, wherein the base comprises of a stabilization system configured to compensate for movements exceeding a previously established motion threshold, wherein the compensation significantly reduces motion affecting the plurality of fixed lenses.

7. The method of claim 1, wherein the delta is an input value for a digital stabilization algorithm, wherein the delta is applied to each of a plurality of media recorded by the camera image sensor associated with each of the plurality of lenses.

8. The method of claim 1, further comprising:
   polling a plurality of accelerometers within the base for camera movement motion during media capture;
   determining a delta associated with the motion for each one of the plurality of fixed lenses; and
   each lens performing optical stabilization based on the delta.

9. A system for image stabilization comprising:
   a stabilization system of a 360 degree camera comprising of a camera housing, a plurality of fixed lenses, and a camera base, wherein each of the plurality of fixed lenses is an assembly comprising an accelerometer, a plurality of optic lenses, and an optic lens adjustment mechanism, wherein the camera base is coupled to the camera housing, wherein the camera base comprises of an accelerometer and a mounting hardware, wherein when the camera is affected by motion during a media capture process, the stabilization system triggers the adjustment mechanism of each of the plurality of fixed lenses to compensate for the motion based on an aggregate adjustment computed from motion data collected from each of the accelerometers of the plurality of fixed lenses; and
   a data store configured to persist at least one of the aggregate adjustment and the motion data, wherein the motion data is at least one of a magnitude and a direction associated with the motion.

10. The system of claim 9, further comprising:
    the stabilization system, computing a delta between motion data obtained from the accelerometer of the camera base and from each accelerometer of each of the plurality of fixed lenses.

11. The system of claim 10, wherein the delta is utilized to programmatically determine the aggregate adjustment.

12. The system of claim 9, wherein the mounting hardware is physically affixed to a surface, wherein the surface is affected by an external force resulting in the surface moving within a physical environment, wherein when the surface is moving, determining a location within the physical environment.

13. The system of claim 12, further comprising:
    the stabilization system, responsive to the determining, identifying a previously established aggregate adjustment associated with the location;
    the stabilization system, conveying the aggregate adjustment to at least one of the plurality of fixed lenses.

14. The system of claim 9, further comprising:
    the stabilization system computing a delta between motion data at a time index obtained from the accelerometer within the camera base and motion data at the time index obtained from the accelerometer within at least one of the plurality of fixed lenses, wherein the delta is at least one of a magnitude and a direction; and the stabilization system programmatically determining an optical stabilization adjustment for the at least one of the plurality of fixed lenses for the time index.

15. The system of claim 9, further comprising:

the stabilization system computing a delta between motion data at a time index obtained from the accelerometer within the camera base and motion data at the time index obtained from the accelerometer within at least one of the plurality of fixed lenses, wherein the delta is at least one of a magnitude and a direction; and the stabilization system programmatically determining a digital stabilization adjustment for media captured during the media capture process by at least one of the plurality of fixed lenses for the time index.

16. The system of claim 9, further comprising:

a sensor manager configured to obtain the motion data from accelerometers in the camera base and in each of the plurality of fixed lenses;

an adjustment engine able to perform an optical digital stabilization function responsive to detecting the motion; and a media corrector configured to perform a digital stabilization function on media captured by the media capture process.

17. The system of claim 9, further comprising:

the stabilization system, selecting a plurality of media captured from the plurality of fixed lenses during the media capture process;

the stabilization system, during a media stitching process, stitching the plurality media into a panoramic media based on the aggregate adjustment, wherein the media is at least one of a video and an image.

18. A computer program product comprising a non-transitory computer readable storage medium having computer usable program code embodied therewith, the computer usable program code comprising:

computer usable program code stored in the non-transitory computer readable storage medium, when said computer usable program code is executed by a processor it polls an accelerometer within a plurality of fixed lenses of a 360 degree camera for a first sensor reading comprising of a motion data, wherein the motion data are changes in at least one of a yaw movement, pitch movement, and roll movement, wherein the motion data is at least one of a magnitude and a direction associated with the yaw, pitch, and roll movement;

computer usable program code stored in the non-transitory computer readable storage medium, when said computer usable program code is executed by the processor it obtains an second sensor reading of different motion data from a different accelerometer within a base of the camera, wherein the base is affixed to a surface, wherein the different motion data is changes in at least one of a yaw movement, pitch movement, and roll movement, wherein the motion data is at least one of a magnitude and a direction associated with the yaw, pitch, and roll movement;

computer usable program code stored in the non-transitory computer readable storage medium, when said computer usable program code is executed by the processor it, encodes the motion data of the accelerometer responsive to the accelerometer detecting a change in at least one of yaw and pitch;

computer usable program code stored in the non-transitory computer readable storage medium, when said computer usable program code is executed by the processor it, responsive to encoding the motion data, conveys the motion data to an optical stabilization actuator within each of the plurality of fixed lenses;

computer usable program code stored in the non-transitory computer readable storage medium, when said computer usable program code is executed by the processor it determines a delta between the motion data and the different motion data, wherein the delta is a difference in at least one of the magnitude and direction of the motion data and the different motion data, when lens shake or camera shake is detected within at least one of the plurality of fixed lenses; and computer usable program code stored in the non-transitory computer readable storage medium, when said computer usable program code is executed by the processor it, responsive to determining the delta, adjusts the at least one of a plurality of optics within each of the plurality of fixed lenses and a plurality of camera image sensors based on the delta during media capture by at least one of the plurality of fixed lenses of the 360 degree camera.

19. The computer program product of claim 18, further comprising:

computer usable program code stored in the non-transitory computer readable storage medium, when said computer usable program code is executed by the processor it selects a plurality of media captured from the plurality of lenses during the media capture process;

computer usable program code stored in the non-transitory computer readable storage medium, when said computer usable program code is executed by the processor it, during a media stitching process, stitches the plurality media into a panoramic media based on the delta, wherein the media is at least one of a video and an image.

* * * * *